United States Patent [19]
Lawler et al.

[11] Patent Number: 5,978,951
[45] Date of Patent: Nov. 2, 1999

[54] HIGH SPEED CACHE MANAGEMENT UNIT FOR USE IN A BRIDGE/ROUTER

[75] Inventors: Christopher P. Lawler, Wellesley; Shannon Q. Hill, Westford; David Lipschutz, Lexington; Thomas A. Radogna, Westborough; John A. Flanders, Ashland; Robert M. France, Littleton; Stephen L. Van Seters, Stow, all of Mass.

[73] Assignee: 3Com Corporation, Santa Clara, Calif.

[21] Appl. No.: 08/927,336

[22] Filed: Sep. 11, 1997

[51] Int. Cl.$^6$ .................................................. H03M 13/00
[52] U.S. Cl. ........................... 714/758; 370/392; 370/401
[58] Field of Search ................................ 371/37.07, 37.7; 370/232, 253, 392, 401, 402, 466; 395/286, 185.02

[56] References Cited

U.S. PATENT DOCUMENTS

| | | | |
|---|---|---|---|
| 5,469,555 | 11/1995 | Ghosh et al. .............................. | 711/133 |
| 5,598,541 | 1/1997 | Malladi .................... | 395/286 |
| 5,640,399 | 6/1997 | Rostoker et al. ........................ | 370/232 |
| 5,708,659 | 1/1998 | Rostoker et al. ........................ | 370/392 |
| 5,742,792 | 4/1998 | Yanai et al. ............................... | 711/162 |
| 5,802,278 | 9/1998 | Isfeld et al. ............................. | 395/200.79 |

*Primary Examiner*—Emmanuel L. Moise
*Attorney, Agent, or Firm*—Weingarten, Schurgin, Gagnebin & Hayes LLP

[57] ABSTRACT

A method and cache management for a bridge or bridge/router providing high-speed, flexible address cache management. The unit maintains a network address cache and an age table, searches the cache for layer 2 and layer 3 addresses from received frame headers, and returns address search results. The unit includes an interface permitting processor manipulation of the cache and age table, and supports a 4-way set associative cache to store the network addresses. A plurality of functions implemented in hardware enables software manipulation of the associated cache. Four cache operating modes are selectable. The unit can identify and select destination ports within a Load Balanced Port Group for frame forwarding. The unit utilizes Virtual LAN identification in conjunction with a MAC address for lookup in the cache. A cyclic redundancy code for each address to be looked up in the cache is used as an index into the cache. If a cache thrash rate exceeds a predetermined threshold, CRC table values can be rewritten. Four time-sliced cache lookup units are provided, each consisting of a cache lookup controller for comparing a received network address to an address retrieved from an identified cache set.

26 Claims, 14 Drawing Sheets

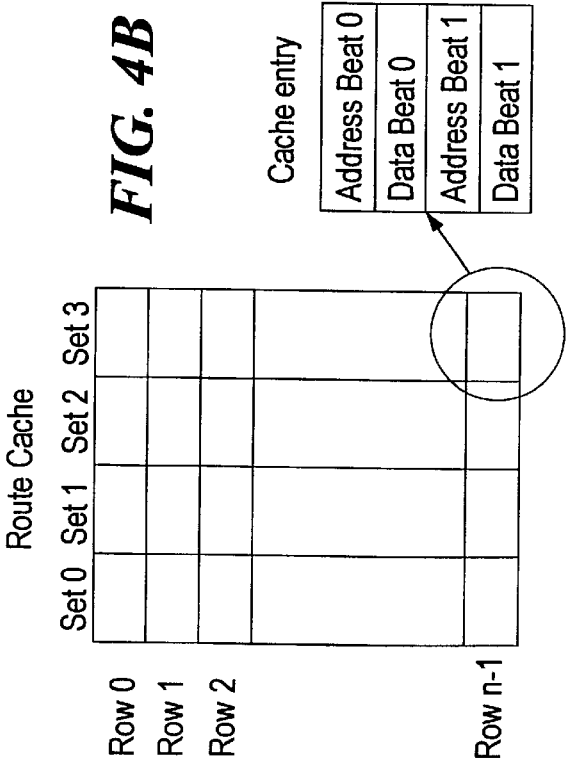
FIG. 5
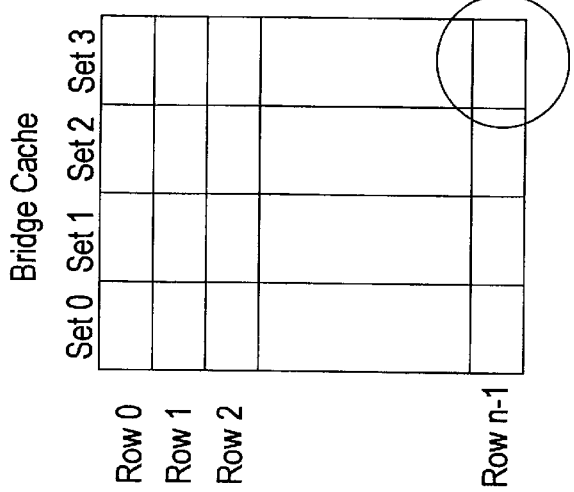
FIG. 4A
FIG. 4B

NIC to ACA data

| Field | Nibbles | cluq bits |
|---|---|---|
| Protocol ID | 2 | 127-120 |
| Destination address length | 2 | 119-112 |
| Receive port | 2 | 111-104 |
| Sequence number | 2 | 103-96 |
| Reserved for future use | 2 | 95-88 |
| Frame control | 2 | 87-80 |
| LEC ID | 6 | 79-56 |
| VLAN ID | 2 | 55-48 |
| Source address | 12 | 47-0 |
| Destination address | 40 | 159-0 |
| Unused | 3 | |

*FIG. 8*

ACA to NIC data

| Bridged Frame | |
|---|---|
| Unicast | Multicast |
| Protocol ID | Protocol ID |
| Frame control | Frame control |
| DA VC handle | DA VC handle |
| | |
| SA search status | SA search status |
| SA address state | SA address state |
| DA search status | DA search status |
| DA address state | DA address state |
| | |
| Unused | Unused |
| Unused | Unused |
| | |
| Unused | Unused |
| RHP vlan ID | RHP vlan ID |
| Unused | Unused |
| | |
| Transmit virtual port | Transmit virtual port |
| LBPG mask | LBPG mask |
| | |
| DA adr group mask(31-24) | Reserved |
| DA adr group mask(23-0) | DA vport mask |
| | |
| DA adr group mask(31-0) | DA adr group mask(31-0) |
| | |
| DA learned port | Puma multicast mask |
| Discard bit, TX encap | Reserved |
| Receive virtual port | Receive virtual port |
| Sequence number | Sequence number |
| | |
| SA software tag | SA software tag |
| DA software tag | DA software tag |
| | |
| | |
| Unused (12 bits) | Unused (12 bits) |

*FIG. 9A*

ACA to NIC data

| Routed Frame | |
|---|---|
| Unicast | Multicast |
| Protocol ID | Protocol ID |
| Frame control | Frame control |
| DA VC handle | DA VC handle |
| | |
| SA search status | SA search status |
| SA address state | SA address state |
| DA search status | DA search status |
| DA address state | DA address state |
| | |
| DA(47-24) | Parent port mask |
| DA(23-16) | Forward port mask(23-16) |
| | |
| DA(15-0) | Forward port mask(15-0) |
| RHP vlan ID | RHP vlan ID |
| ACA vlan ID | ACA vlan ID |
| | |
| Transmit virtual port | Transmit virtual port |
| LBPG mask | LBPG mask |
| | |
| QOS(39-32) | QOS(39-32) |
| QOS(31-8) | QOS(31-8) |
| | |
| DA adr group mask(31-0) | DA adr group mask(31-0) |
| | |
| DA learned port | Puma multicast mask |
| Discard bit, TX encap | Reserved |
| QOS(7-0) | QOS(7-0) |
| Sequence number | Sequence number |
| | |
| SA software tag | SA software tag |
| DA software tag | DA software tag |
| | |
| | |
| Unused (12 bits) | Unused (12 bits) |

*FIG. 9B*

Bridge cache address beat

| 87 | 86  80 | 79       56 | 55    48 | 47                0 |
|----|--------|-------------|----------|---------------------|
| Lock | Spare | Lec ID | VLAN If | MAC address |

Bridge cache unicast data beat

| 87              56 | 55  48 | 47 45 | 44 40 | 39   32 | 31   16 | 15   0 |
|--------------------|--------|-------|-------|---------|---------|--------|
| Address port group | Learned port | Bridg misc | xmit encap | Address state | Software tag | Circuit handle |

Bridge cache multicast data beat

| 87 80 | 79         56 | 55  48 | 47 45 | 44 40 | 39   32 | 31   16 | 15   0 |
|-------|---------------|--------|-------|-------|---------|---------|--------|
| Rsrv | Address port mask | Puma mask | Bridg misc | Rsrv | Address state | Software tag | Circuit handle |

*FIG. 10*

Route cache address beat 0

| 87 | 86  85 | 84  80 | 79                              0 |
|----|--------|--------|-----------------------------------|
| Lock | Spare | Proto ID | Network address(79-0) |

Route cache address beat 1

| 87         80 | 79                                0 |
|---------------|-------------------------------------|
| Unusable | Network address(159-80) |

*FIG. 11*

Route cache unicast data beat 0

| 87 80 | 79 64 | 63 56 | 55 48 | 47 45 | 44 40 | 39 32 | 31 16 | 15 0 |
|---|---|---|---|---|---|---|---|---|
| Dest VLAN | Rsrv | Rsrv | Learned port | Route misc | Xmit encap | Address state | Software tag | Circuit handle |

Route cache unicast route flow data beat 1

| 87 40 | 39 0 |
|---|---|
| MAC destination address | QOS flow data |

Route cache unicast bridge flow data beat 1

| 87 72 | 71 40 | 39 0 |
|---|---|---|
| Reserved | Address port group | QOS flow data |

Route cache multicast data beat 0

| 87 80 | 79 56 | 55 48 | 47 45 | 44 40 | 39 32 | 31 16 | 15 0 |
|---|---|---|---|---|---|---|---|
| Dest VLAN | Reserved | Puma mask | Route misc | Rsrv | Address state | Software tag | Circuit handle |

Route cache multicast data beat 1

| 87 64 | 63 40 | 39 0 |
|---|---|---|
| Parent port mask | Forward port mask | QOS flow data |

*FIG. 12*

ACA cache status bits

| Bit description | Bit position |
|---|---|
| Cache hit | 7 |
| Load balanced port group equal | 6 |
| Port equal | 5 |
| Incomplete search | 4 |
| Soft path only | 3 |
| Lec id equal | 2 |
| Broadcast (bridge addresses only) | 1 |
| Multicast (bridge addresses only) | 0 |

*FIG. 14*

Network address state field bits

| Bit description | Bit position |
|---|---|
| Multicast identifier | 39 |
| CRC not required | 38 |
| Quality of service loss | 37 |
| Queue select high | 36 |
| Queue select low | 35 |
| Internal address | 34 |
| Notification High | 33 |
| Notification low | 32 |

QOS flow data

| Bit description | Bit positions |
|---|---|
| Class of service (COS) | 39-36 |
| Reserved | 35-32 |
| Minimum packet size | 31-28 |
| Token bucket depth | 27-16 |
| Token bucket index | 15-8 |
| QOS state flags | 7-0 |

QOS state flags

| Bit description | Bit position |
|---|---|
| QOS enable | 7 |
| RSVP flow indicator | 6 |
| Excess action code | 5-4 |
| Excess monitor enable | 3 |
| Excess loss eligible flag | 2 |
| Excess transmit queue | 1-0 |

Bridge Misc field

| Bit description | Bit position |
|---|---|
| Static | 47 |
| Reserved | 46 |
| Reserved | 45 |

Route Misc field

| Bit description | Bit position |
|---|---|
| Reserved | 47 |
| Discard | 46 |
| Alternate source address | 45 |

*FIG. 13*

HIGH SPEED CACHE MANAGEMENT UNIT FOR USE IN A BRIDGE/ROUTER

RELATED APPLICATIONS

Not Applicable

STATEMENT REGARDING FEDERALLY SPONSORED RESEARCH

Not Applicable

BACKGROUND OF THE INVENTION

Network devices such as bridges and routers are employed in networks which are operating at relatively high speeds. Functions such as frame header parsing, address lookup, frame processing, and related functions have previously been performed primarily in software. Software processing of frames results in higher device latency, implicating a higher frame drop rate due to congestion and the necessity of providing expensive buffering.

SUMMARY OF THE INVENTION

The presently disclosed cache management unit is also referred to herein as an Address Cache ASIC (ACA), though the functions and features presently described are also realized, in alternative embodiments of the invention, via any other hardware structure. The ACA is preferably used as one element of a network device such as a bridge or bridge/router, and provides high-speed, flexible address cache management. The ACA is responsible for: maintaining a hardware address table and a hardware age table; searching the hardware address table for layer 2 and layer 3 addresses received from a Received Header Processing (RHP) element which parses frame headers for address information; and returning address search results, including the destination port(s) for received frames, to a Received Frame Processor (RFP) element. The ACA includes an interface which permits a Frame Processor to manipulate the hardware address table and age table.

A cache associated with the ACA stores data associated with each of plural network addresses. The ACA receives packets of source and destination addresses from RHP's in the network device, and searches the associated cache for each address. The ACA responds to the appropriate RFP with a response packet which indicates whether the source and destination addresses were located (hit) in the cache and, for each located address, includes data associated with that address. If there was a hit, the RFP generates a transmit vector which contains information which permits the frame to be processed in hardware at speeds approximating frame reception rates. The ACA supports a 4-way set associative cache to store the network addresses. This hardware implementation provides better performance than the binary search table employed in the prior art due to a significantly shorter search time in the cache.

The ACA, through a plurality of discrete functions implemented by ACA hardware, enables software manipulation of the associated cache. Such manipulation includes installing entries, removing entries, changing entries and diagnosing the memory. Entry installation by a processor executing such software is the mechanism by which the cache learns new addresses. One further function, the SEARCH function, enables automatic address processing and lookup in the cache by the ACA without software intervention.

The ACA provides four cache operating modes: DISABLE, LEARN, BRIDGE ONLY, and BRIDGE/ROUTE MODE. When in DISABLE mode, the cache is accessible only through diagnostic read and write operations. In LEARN mode, address installation, as well as diagnostic read and write operations, are enabled. In BRIDGE ONLY mode, the cache is employed solely for storing data associated with bridge addresses. Lastly, in BRIDGE/ROUTE mode, the cache is divided into equal portions for layer 2 (bridge) address processing and for layer 3 (route) address processing.

In a network element which supports Load Balanced Port Groups (LBPGs), a group of ports treated as a single high-bandwidth port, the presently disclosed ACA identifies and selects destination ports within the identified LBPG for respective frame forwarding.

When functioning in a network bridge which supports Virtual Local Area Networks (VLANS), the present ACA utilizes the VLAN identification in conjunction with the MAC for address lookup in the cache.

A cyclic redundancy code is generated for each address to be looked up in the cache by the ACA. The CRC code is used as the index for lookup within the cache. As noted, the cache is 4-way associative, meaning that there are four sets of addresses and data for each CRC code. If the thrash rate exceeds a predetermined threshold, software can rewrite the CRC table values, thus causing alternative CRC codes to be generated, and avoiding the high thrash rate problem.

Finally, owing to the fact that the cache itself is accessed at most once out of every four clock cycles for a single address search, the presently disclosed ACA provides four cache lookup units, each being provided with access to the cache every four clock cycles. Each cache lookup unit consists of a cache lookup queue for storing the CRC code of the address to be searched, and a cache lookup controller for pulling codes from the queue concatenated with a set number from a least-recently-used table value for the code, and compares the network address associated with the code to that of the identified set. If the addresses match, the controller signals that the lookup is complete and moves on to the next code in the queue. Otherwise, when all sets are exhausted without a match, the controller reports the failure to match and moves on to the next code in the queue.

Thus, the presently disclosed ACA enables network address lookup to permit frame processing at high speed while enabling flexible modification and diagnosis of the cache via software instituted functions.

BRIEF DESCRIPTION OF THE DRAWINGS

The invention will be more fully understood by reference to the following Detailed Description of the Invention in conjunction with the drawings of which:

FIG. 4A illustrates the organization of at least a portion of the Address Cache of FIG. 3 configured as a Bridge Cache;

FIG. 4B illustrates the organization of at least a portion of the Address Cache of FIG. 3 configured as a Route Cache;

FIG. 5 illustrates the format of words used to address the Address Cache of FIG. 3;

FIG. 8 illustrates the data content of a packet transmitted from a Network Interface Chip (NIC), associated with a Network Interface Module, to the ACA;

FIGS. 9A and 9B illustrate the data content of bridged and routed frame packets transmitted from the ACA to a Network Interface Chip (NIC);

FIG. 10 illustrates bridge cache beat formats;

FIGS. 11 and 12 illustrate route cache beat formats;

FIG. 13 illustrates specifics of various fields of FIGS. 10–12; and

FIG. 14 provides a description of the status bits sent from the ACA to a Network Interface Chip.

DETAILED DESCRIPTION OF THE INVENTION

Figure 1:
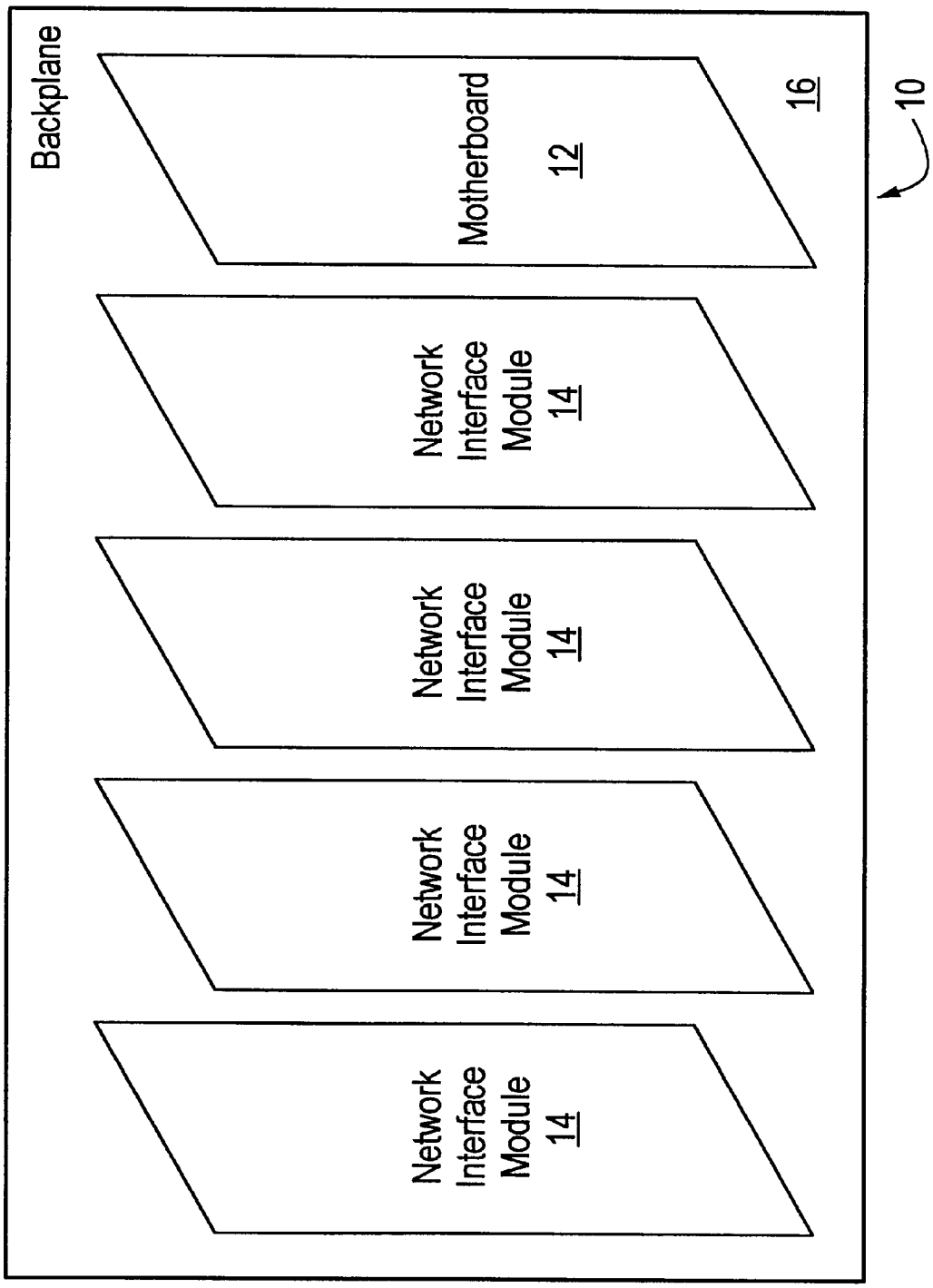
FIG. 1 is pictorial diagram of a network device in accordance with the present invention illustrating Network Interface Modules and a Motherboard mounted to a backplane.
Figure 2:
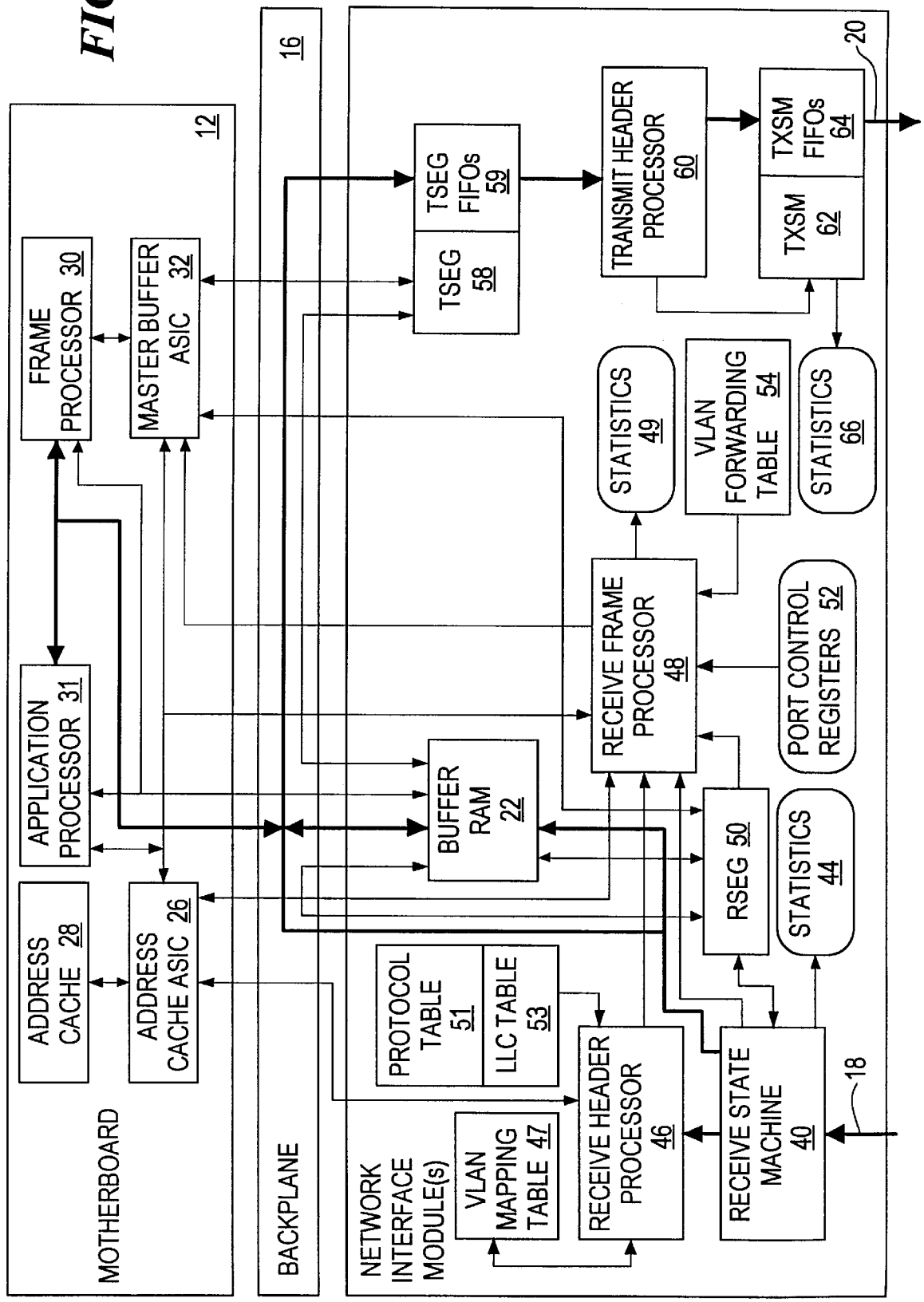
FIG. 2 is a block diagram of a network device in accordance with the present invention illustrating one Network Interface Module coupled to the Motherboard via a backplane.

FIGS. 1 and 2 Overview

Referring to FIGS. 1 and 2, a bridge/router network device 10 for use in a telecommunications network includes a motherboard 12 and at least one network interface module 14. Each of the network interface modules 14 interfaces to the motherboard 12 through a backplane 16.

Each network interface module 10 includes at least one input port 18 through which data units such as frames, packets and cells are received and at least one output port 20 through which data units are forwarded downstream for receipt by another network device. In particular, the ports provide connections via communication links to other devices in the network. Incoming data units may be bridged, routed, translationally routed or filtered.

In one embodiment of the presently disclosed network device 10, four slots are provided for network interface modules 14. Each slot may be populated with an Ethernet, FDDI or an ATM UNI interface module. In a preferred embodiment, each 10/100 megabyte Ethernet network interface module 14 includes six input/output ports, each FDDI network interface module 14 includes six input/output ports, and each gigabit Ethernet network interface module 14 includes one input/output port. An ATM network interface module 14 includes four OC3 input/output ports or one OC12 input/output port.

Elements in the motherboard 12 and interface modules 14 are responsible for data unit reception and transmission, parsing of data link and network layer headers within received frames, look-up of source and destination Media Access Control ("MAC") and network layer addresses and for making forwarding decisions regarding the received frames.

The motherboard 12 includes an address cache ASIC ("ACA") 26 with an associated cache 28, a Frame Processor 30, an application processor 31 and a Master Buffer ASIC ("MBA") 32.

The ACA 26 serves to perform look-ups on source and destination addresses (SAs and DAs) passed to the ACA from a Receive Header Processor ("RHP") within the respective network interface modules 14. The ACA 26 is capable of looking up MAC addresses for bridging support and Network Layer destination addresses for routing support.

The MBA 32, located on the motherboard 12, serves to provide global data buffer management of frames which reside in buffers in the Buffer RAM 22 disposed on respective Network Interface Modules 14.

Each network interface module 14 includes a receive ASIC and a transmit ASIC, both of which are specific to the type of data traffic supported by the respective network interface module (such as Ethernet, ATM and FDDI).

Address Cache ASIC (ACA) Overview

The principle functions of the Address Cache ASIC (ACA) 26 include maintaining hardware address tables, maintaining a hardware age table, searching the hardware address table for layer 2 and layer 3 addresses provided by network interfaces, returning address search results including a destination port identifier for received frames to the network interfaces, and providing a mechanism for software to manipulate the hardware address table and age table. A 4-way set associative cache 28 (discussed subsequently) is employed to store network addresses.

The main function of the ACA 26 is to look up network addresses in the cache 28. The ACA receives packets containing two addresses, a source address and a destination address, from the Network Interface Chips (NICs) 100. The ACA 26 searches the cache 28 for each of these addresses and responds to the Network Interface Module (NIM) 14, and more specifically to the respective NIC that sent the packet after the searches are completed, by assembling a response packet and forwarding the packet to the respective NIC 100. The response packet indicates whether or not the addresses were found in the cache 28 and, for each found address, the packet includes data stored in association with the network address. A more detailed explanation of this process is provided subsequently.

The ACA 26 also provides an interface for software to manipulate and diagnose the cache 28. A Frame Processor (FP) 30 allows software to install and remove network addresses and associated data from the cache 28. Although the ACA does not learn addresses by itself, it provides hardware assistance, through Programmable Input/Output (PIO) register sets 102, in installing addresses in the cache at a rate of approximately 500K addresses per second. The FP 30 also provides a software path (soft path) accessible into an age RAM and hardware assistance during the aging process.

The ACA 26 runs at speeds approximately the frame reception rate (wire speed) to avoid a costly and complex queuing system for received frames. To achieve wire speed, the ACA handles 4 million packets per second from the NICs 100. In contrast, received frames handled by software can be processed at approximately ½ million packets per second. Since each packet from a NIC 100 contains two addresses (SA and DA), the ACA 26 must be able to search the entire cache 8 million times per second, or 4.5 cycles per search at an ACA clock rate of 37.5 MHz.

The cache 28 stores data link and network layer addresses. As described later, the cache can be configured as a bridge only cache or as a split bridge/route cache. The bridge cache store both data link layer SAs and DAs, while the route cache store network layer DAs and link layer SAs.

If a frame is intended for a destination address which is not in the cache 28, the frame is transmitted out all ports under software control. If a reply frame is received from the device having the uncached MAC address, the port associated with the previously unknown DA address becomes known and the frame is forwarded via a high-speed hardware forwarding path within the device 10 since the reply frame destination address (the original source address) is known and included in the cache. Software updates the cache to include the address of the station having the original, unknown destination address (the subsequent source address). Software also updates the cache 28 if the ACA 26 determines that the source address data received does not agree with the source address data stored in the cache. This situation may arise in the event a device is moved such that frames it originates are received at a different port of the device 10. The ACA 26 also makes a determination of whether the destination address and the source address are on the same segment, and if so, constructs a packet indicating this situation to the RFP 46, which will inhibit retransmission of the frame.

In a preferred embodiment, the address cache 28 is 4-way set associative, can vary in depth up to a maximum of 16K rows, and is 88 bits wide. Each cache row contains four cache entries, one per set. The cache 28 itself is implemented in SRAMS and the ACA 26 supports both X8 and X16 devices. For a cache organized as bridge-only cache, there are two storage elements or "beats" per bridge cache set (FIG. 4A). For a bridge-route cache, there are four beats per route cache set (FIG. 4B). The specific format of these beats are found in FIGS. 10, 11 and 12. FIG. 13 provides details of what is stored in various fields in FIGS. 10, 11 and 12.

At a high level, a cache lookup occurs as follows. An address to be searched (MAC SA, MAC DA, or network DA) is received by the ACA 26. A Cyclic Redundancy Code (CRC) process is performed by a CRC engine 104 on the address to generate a CRC. This code is then used to identify a cache row. There being four sets associated with each cache row, the ACA uses a Least Recently Used (LRU) algorithm to identify a set order for address comparison, and a valid table is referenced to identify whether any of the sets are invalid. From the latter two values, a most likely, valid set in the identified cache row is chosen, and the address value stored therein is compared against the address from which the CRC was generated. If a match occurs, the data stored in conjunction with that address in the cache set is retrieved and returned to the respective NIC 100. If no match occurs, the next valid set in the row is selected and compared to the received address. When all valid sets have been searched without a match, an indication thereof is forwarded to the frame processor 30 so that the received frame can be processed under software control.

With reference to FIG. 5, the cache address generated by the ACA 26 for the purpose of addressing the cache 28 has three parts. A CRC generated from the address of interest is known as a "hash." The hash serves as a row index into the cache, and identifies a row of four sets, i.e. sets 0–3 (see also FIGS. 4A and 4B). The set index identifies one of four cache sets in the row. A Cache Line Index (CLI) identifies a line (or "beat") within a cache set; the CLI is one bit for the bridge cache and two bits for the route cache. For bridge/route addresses, each half of the cache 28 is addressed differently. The most significant bit of the cache address indicates whether the address is for the bridge or route cache searching.

The ACA 26 accesses the cache 28 once per cycle. In the worst case, the ACA must read and compare to the address beat of all four sets before a match (or "hit") occurs. Subsequent to a hit occurring, a cycle is needed to read the associated data beat, for a total of five cycles. This is more than the 4.5 cycle maximum required to operate at wire speed. However, if the hit occurs on the first, second or third compare, the total time is up to 4 cycles, below the maximum. On average, the search time will be below the 4.5 cycle threshold.

However, the presently disclosed ACA 26 is provided with a fallback option. The number of addresses queued up to be searched is monitored, and if it reaches a given threshold, the ACA 26 operates in a degraded mode where the maximum number of sets searched is reduced. When the number of enqueued searches falls below the threshold again, the normal search mode involving the search of up to all four sets is resumed.

While each route address set is provided with four beats, two for address and two for data, not every lookup of a route address will require comparison against both address beats. If the route network layer destination address is less than ten bytes in length, the second address beat is not used. Both data beats are used regardless of the length of the address compared.

For a short route address (less than ten bytes), the worst case search requires four address compares, and two cycles for data retrieval. All route frames have a MAC layer SA which has a worst case search of five cycles, as above. Therefore, the ACA 26 processes route frames with short addresses in eleven cycles, worst case. In degraded mode, limiting the number of sets searched per row, the ACA 26 does three searches on the MAC layer SA and three searches on the network layer DA. The maximum search time is then reduced to an acceptable nine cycles.

For long route addresses (eleven bytes or more), the worst case search involves two address beat reads per set (eight cycles) plus two data reads, for a total of ten cycles. Five more cycles are added by the MAC SA address search for a overall total of fifteen cycles. In degraded mode, three searches are performed at the MAC SA layer, and one search is performed for the network layer DA. The maximum search time, in degraded mode, for a long route address, is therefore eight cycles.

The ACA 26 implements a Least Recently Used (LRU) policy for replacing and searching cache lines. An LRU table 106, stored in internal RAM, provides entries for each cache line. Each LRU table 106 entry provides an ordered series of four numbers, zero through three, indicating the most recently used set in the respective line through the least recently used set of the same line. For instance, a value of "2013" for a given cache line indicates that set "2" was most recently used, and set "3" was least recently used. When all four sets in a row are full, and the frame processor 30 is going to install a new address in one of the sets, the set that was least recently used is chosen for replacement. In the foregoing example, the address and related data in set "3" would be overwritten. When a set, which is not the most recently used, is hit, the respective LRU bits are swapped with the previous set in the order. For example, if the LRU code is 2013 and a hit occurs on set 3, the set LRU order then becomes 2031. When a set is installed via frame processor 30 intervention, it becomes the most recently used set. So if the LRU for a cache line is initially "2013" and a new address and data are installed in set "3", the LRU entry for this line becomes "3201". Finally, when a set is removed, it becomes the least recently used set.

The LRU bits are also used to determine how the sets within the cache are searched. The set that has been most recently seen is searched first. The least recently searched set is tested last. The ACA stores VALID bits for each of the cache 28 entries in the same internal RAM as the LRU table. The VALID bits are used to optimize the address lookups. The VALID bits are read before the cache lookup begins, to provide an indication of which sets are available for searching. After eliminating sets according to the VALID bits, sets are searched according to the LRU bit order.

The size of the cache is variable in the number of cache rows only. The size of the cache 28 is conveyed to the ACA 26 via the PIO register sets 102; the ACA 26 uses the cache size information to mask out hash bits from the CRC engine 104. The LRU and VALID tables 106, 108 in the ACA 26 are directly related to the cache 28 size.

Figure 6A:
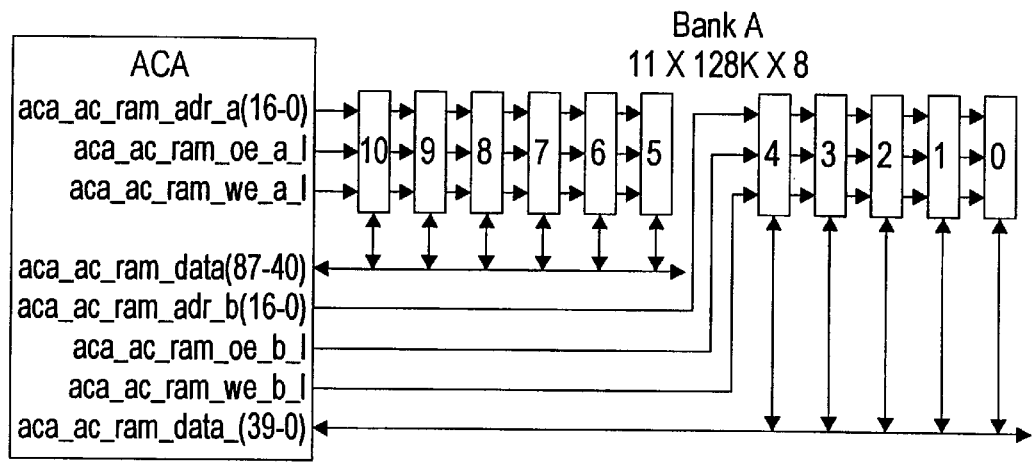
FIGS. 6A, 6B and 6C are block diagrams of various physical configurations of memory devices comprising the Address Cache of FIG. 3 in conjunction the ACA.
Figure 6B:
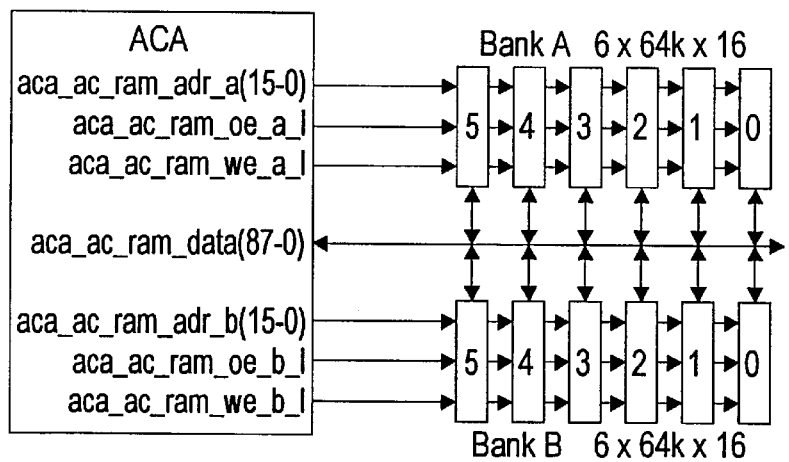
Figure 6C:
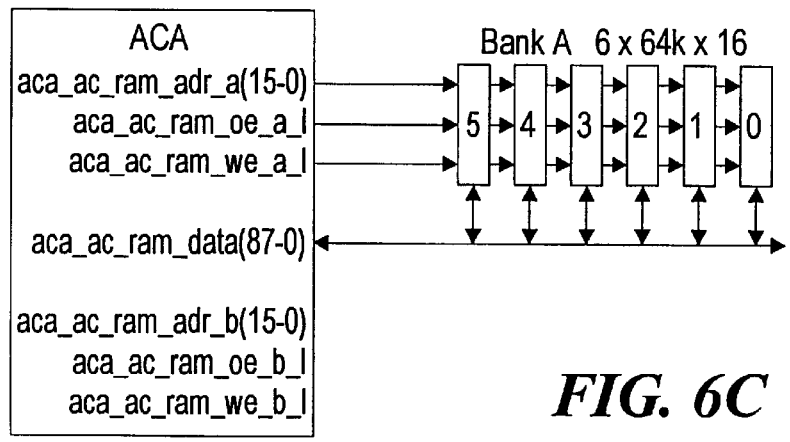

The cache 28 is physically configured in one of three ways in the first embodiment, though other configurations are also envisaged. These three configurations are shown in FIGS. 6A, 6B and 6C. Each configuration supports multiple SRAM depths. The cache 28 configuration information is required by the ACA 26 to properly generate SRAM addresses and control signals. The ACA performs this by recognizing the number of SRAM banks and the total depth of the cache in the PIO register sets 102.

The ACA 26 is implemented in VHDL code in a first embodiment, though other hardware implementations of the same functions described herein are employable in further embodiments. A block diagram of the ACA 26 is presented in FIG. 3. Each of four Network Interface Modules (NIMs) 14 provides up to two Network Interface Chips (NICs) 100 selected according to the network which will be connected thereto. Exemplary networks include Ethernet, FDDI, and ATM. In a first embodiment of the present invention, the interface elements illustrated in FIG. 2 associated with the NIM 14 are collectively disposed on a respective NIC 100, and up to eight NICs 100 are interfaced to the ACA 26 on the motherboard 12. Four bit connections are employed for conveying received frame information to the ACA 26 from each NIC 100. The ACA 26 controls each of these interfaces separately such that the eight NICs 100 are able to send frames simultaneously.

Figure 3:
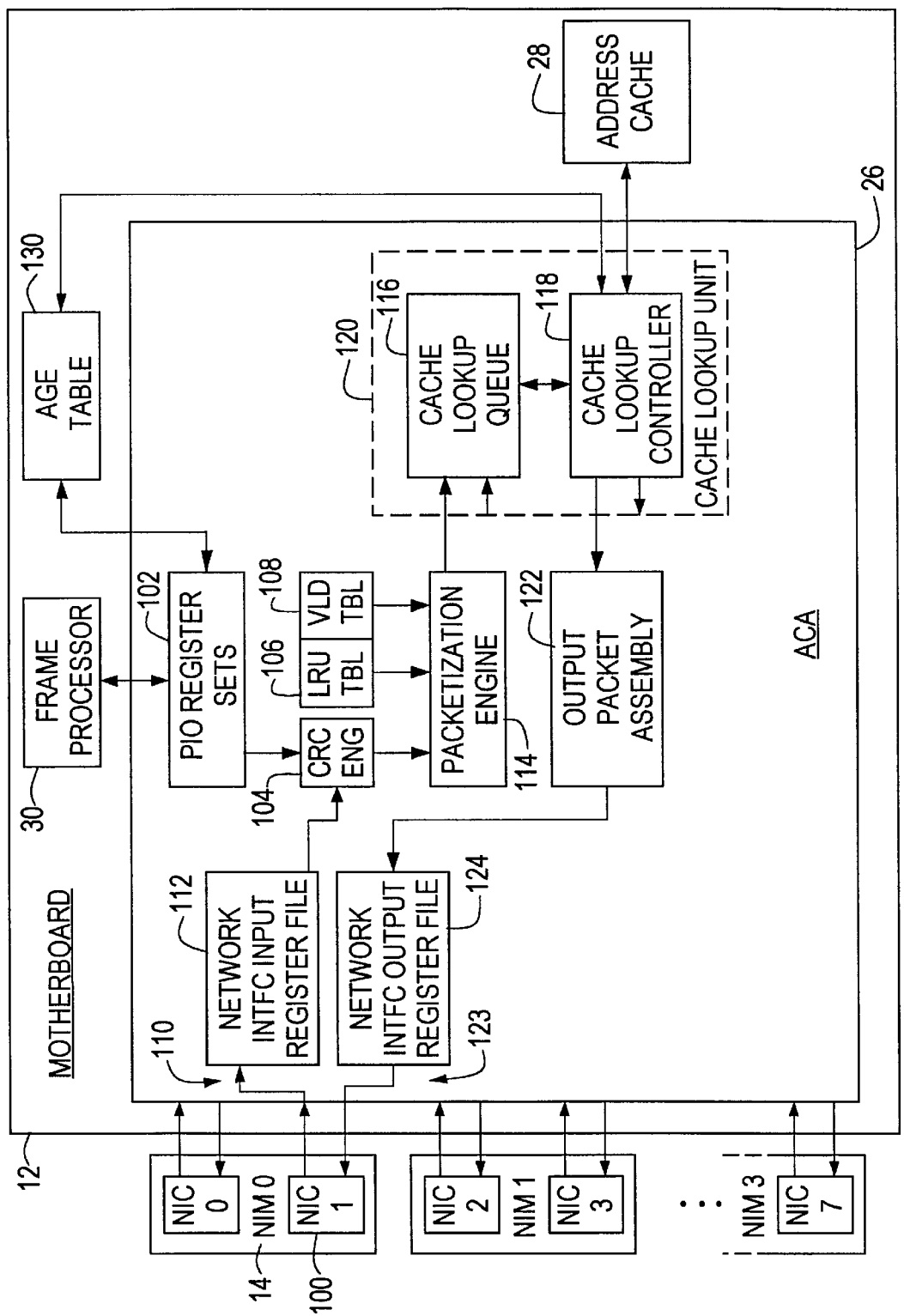
FIG. 3 is a block diagram of an Address Cache ASIC (ACA) according to the present invention, interfaced to an Address Cache, Frame Processor, and plural Network Interface Modules.

The ACA 26 itself is comprised of a number of functional circuit elements, as shown in FIG. 3. To avoid confusion in the drawing, not all communication paths are illustrated in FIG. 3; the accompanying text defines those paths. The illustrated elements are with respect to a single NIC 100, except where noted herein. These elements are responsible for receiving information taken from a received frame, using this information to lookup data in the cache 28, and for returning the looked up data to the source NIC 100.

Figure 7A:
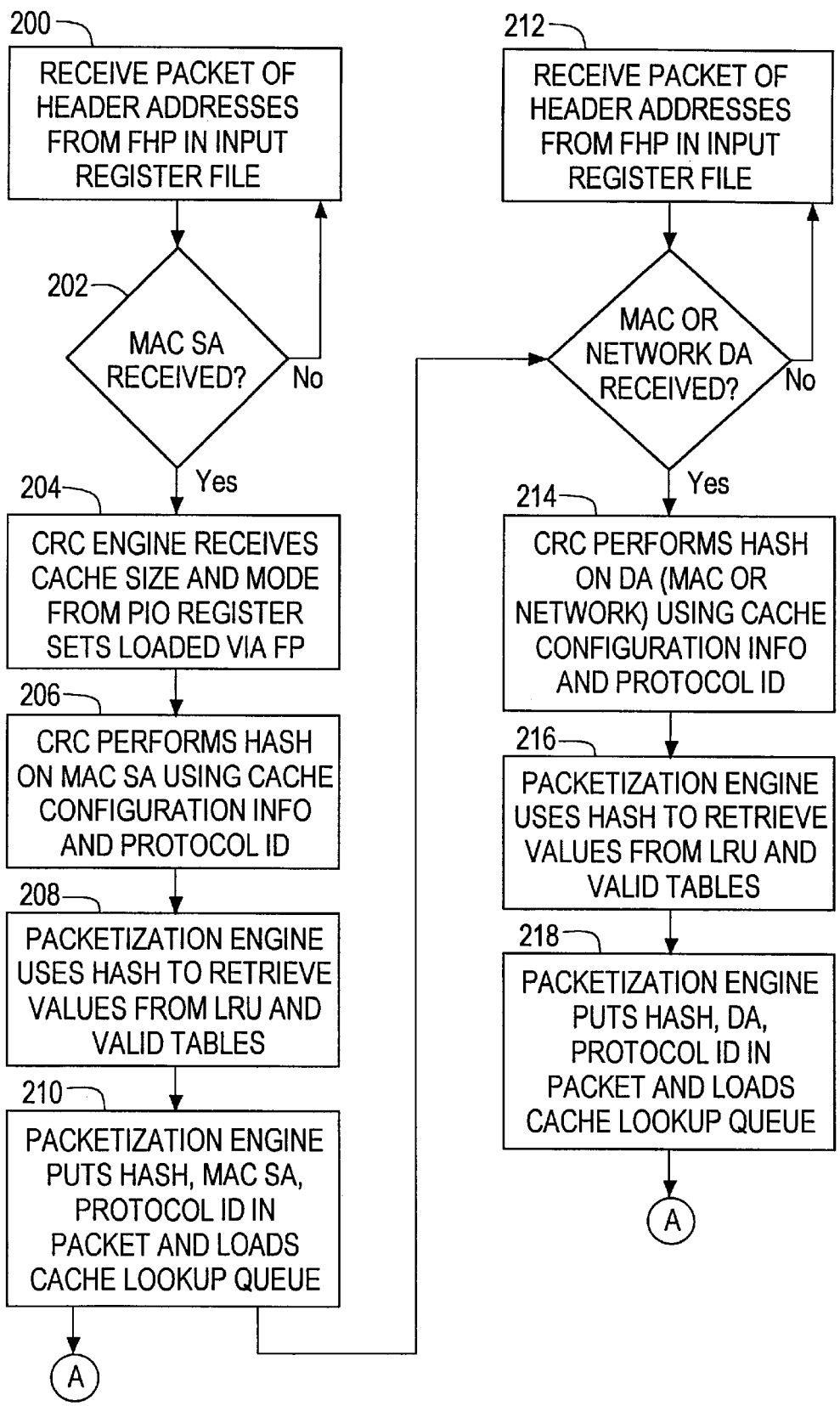
FIGS. 7A, 7B and 7C collectively comprise a flow diagram of the method of operation of the ACA and Address Cache according to the present invention.
Figure 7B:
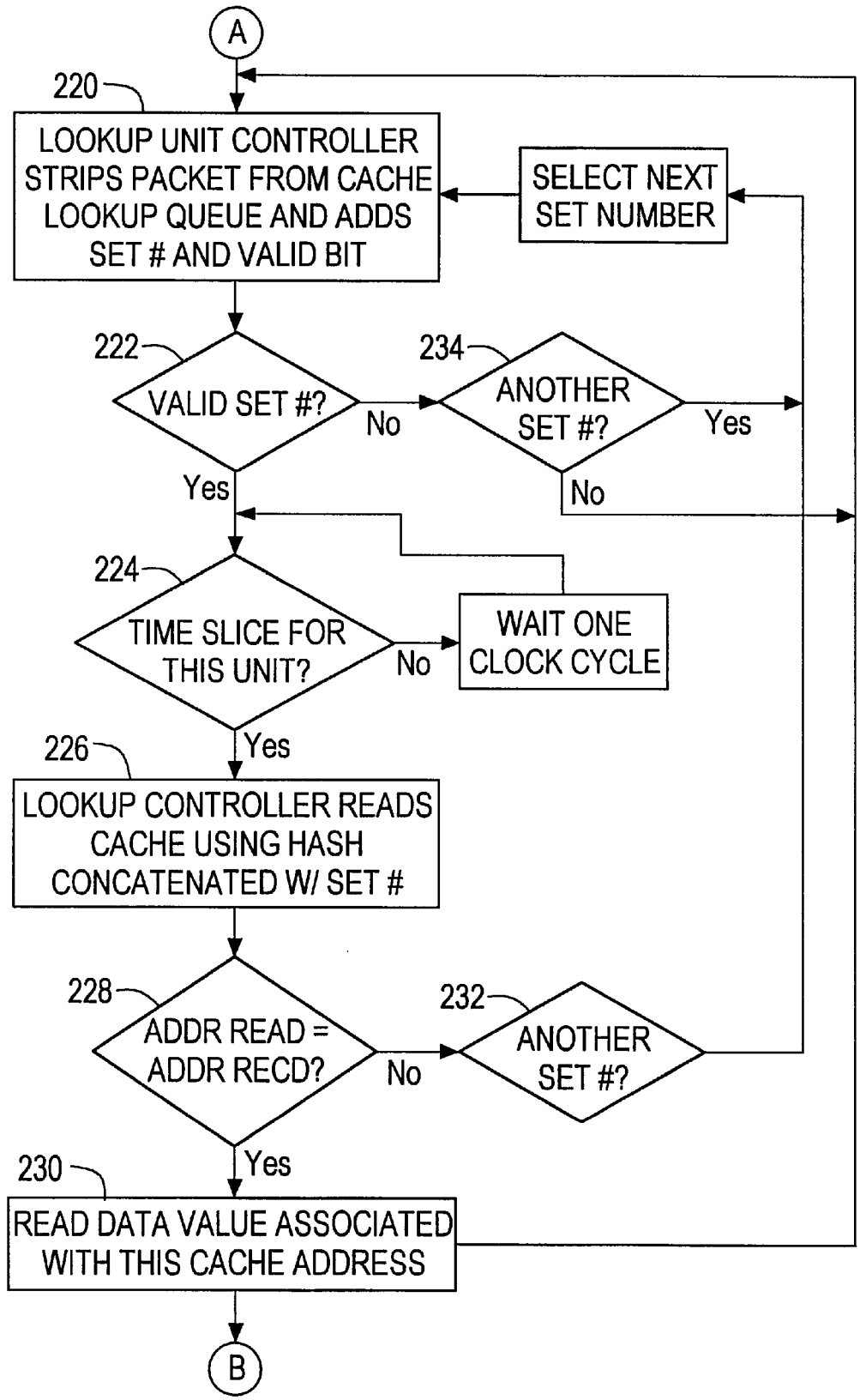
Figure 7C:
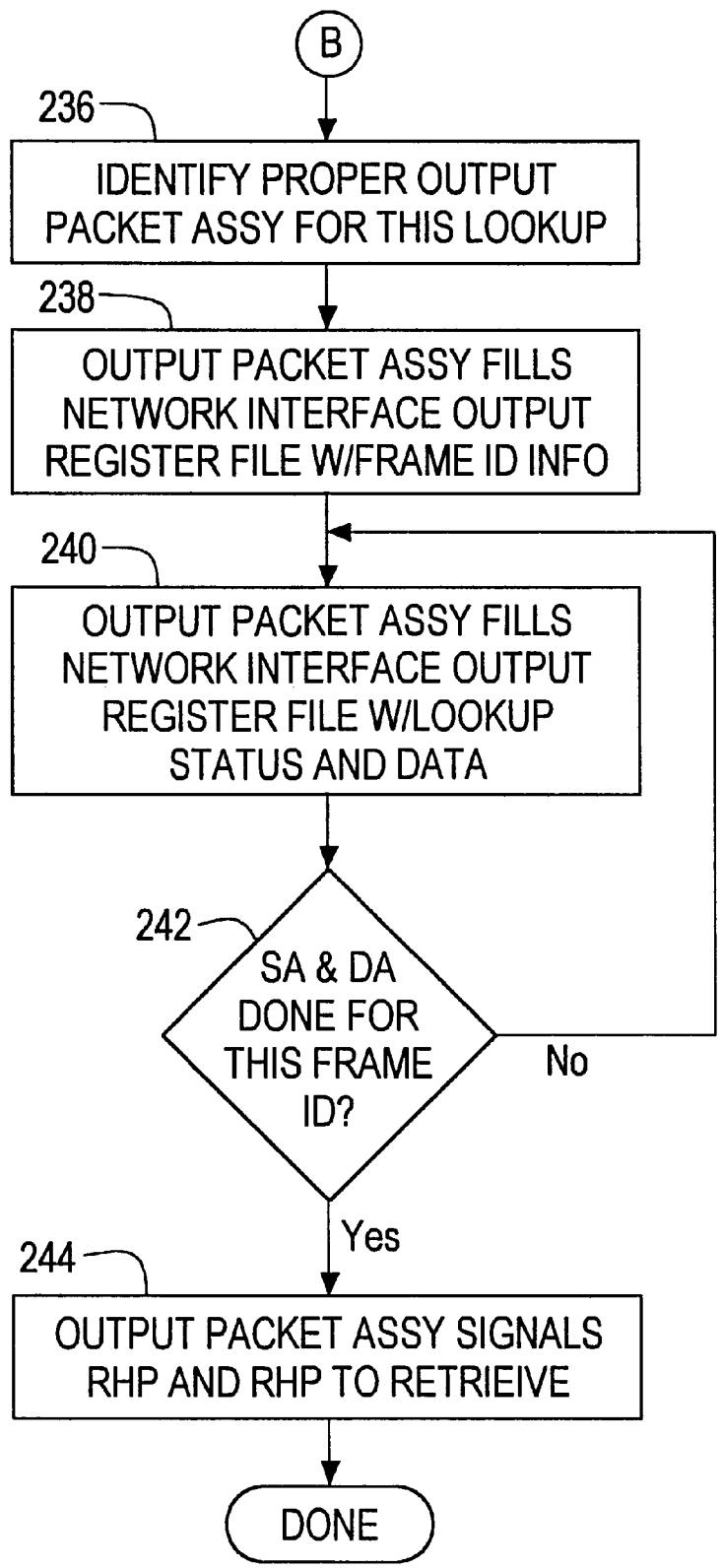

In conjunction with the block diagram of FIG. 3 and the flow diagrams of FIGS. 7A, 7B and 7C, the typical flow of frame information through the ACA 26 is now described. Specifically, the NIC 100 strips information out of the received frame and creates a packet to be sent to the ACA 26. These packets, illustrated in FIG. 8, contain such information as Protocol ID (identifying the routing protocol of the received frame), source address and destination address, all taken from the received frame header. The ACA 26 monitors the four bit input interface 110 from the NIC 100 waiting for a non-zero value indicative of the start of a transfer from the NIC 100 to the ACA 26 (step 200). The input is received from a Receive Header Processor (RHP) 46 which is responsible for examining the frame header to identify the frame encapsulation and the routing protocol, if any. The RHP 46 also constructs a packet, discussed subsequently, including the SA, DA and protocol ID derived from the received frame. The ACA 26 knows the exact length of the transfer so it knows when the transfer is complete and the next transfer can follow immediately without intervening idle cycles.

The packet of information is transferred from the NIC 100 to a network interface register file 112 in the ACA as it comes in. The format of such a packet is illustrated in FIG. 8. The ACA 26 does not wait for the entire packet to arrive before starting to operate on the packet. As shown in FIG. 8, each packet has two addresses, the first always being a MAC layer Source Address (SA) and the second being either a MAC layer Destination Address (DA) or a network layer DA. The ACA 26 splits the input packet into two cache lookup operations, one for the SA and one for the DA.

As the SA is received (step 202), it is applied to a CRC generator (CRC ENG) 104 (step 204) and a 16-bit CRC is generated (step 206). The CRC is done four bits at a time to match the arrival rate of the address so that clock cycles are not wasted. The CRC result is conjoined with configuration information from the PIO register sets and the protocol ID from the NIC 100 to form a "hash" value. The hash is used to select the cache row in which to search for the SA. The SA, the hash, the LRU value for the hash from the LRU table (LRU TBL) 106, and the VALID value for the hash from the VALID table (VLD TBL) 108 are packetized by a packetization engine 114 (step 208). This packet is placed in a cache lookup queue 116 for further processing by a cache lookup controller 118 (step 210).

The destination address next becomes available from the NIC 100 in the network interface input register file 112 (step 212). The CRC engine 102 operates on the DA to generate its hash value (step 214) and another cache lookup packet is created (step 216) and stored in the cache lookup queue 116 (step 218), awaiting processing by the cache lookup controller 118.

The cache lookup queue 116 and the cache lookup controller 118 collectively comprise the cache lookup unit 120. The controller 118 is responsible for stripping packets off the cache lookup queue 116 (step 220) and carrying out the cache lookup. There are four cache lookup units 120 in the ACA 26, one for every two NICs 100, or in other words, one for every NIM 14. In FIG. 3, the input to the cache lookup queue 116 and the output to the cache lookup controller 118 are illustrated, and are connected to another packetization engine and output packet assembly, respectively. The cache lookup controllers 118 are time sliced into the cache 28 such that each gets access to the cache 28 every four clock cycles. Four cycles are required for each lookup. In the first clock cycle, a cache 28 read is performed by the cache lookup controller 118 based upon hashed address information retrieved from the cache lookup queue 116. In the second clock cycle, the address information from that location is loaded into a register along with the address from the cache lookup queue 116. In the third clock cycle, these two addresses are compared. The results are processed by the cache lookup controller in the fourth clock cycle, including making the decision of whether to forward lookup results to the output packet assembly 122 and whether there is another address enqueued in the cache lookup queue 116. Each of the four cache lookup controllers 118 are 90 degrees out of phase. Thus, if all of the cache lookup queues 116 have addresses to be looked up, the pipeline to the cache 28 will be fully utilized. For purposes of simplicity and the maintenance of frame order, there is no sharing of unused clock cycles between cache lookup units 120 in the presently disclosed embodiment.

The controller 118, during its allotted clock cycle (step 224), reads the cache (step 226) using the hash value stored in the queue 116 concatenated with the set number generated using the LRU table 106 and VALID tables 108 values (step 222) for the address to be searched. If the address parsed from the frame header and the address stored in the set identified by the cache lookup queue 116 output match (step 228), the data associated with that set is read out by the cache lookup controller 118 (step 230) and the controller 118 signals that the lookup is complete. If the addresses do not match, the next set (step 232), identified by the LRU and VALID values, is searched. When all sets are exhausted without an address match, the cache lookup controller 118 signals that the lookup is complete and moves on to the next address to be searched in the cache lookup queue 116 (step 234).

Similar to the input side, the ACA 26 has a four bit connection to each of the eight NICs 100 for sending the search results to the RHP 46 and RFP 48. The ACA 26 controls each of these interfaces separately so that output packets can be sent to the NICs 100 simultaneously.

With respect again to FIG. 3, each cache lookup unit 120 is bound to two NIC 100 output interfaces, the same two that are connected as inputs to the unit 120. This avoids frame re-ordering or the need for complex time-stamping to avoid re-ordering.

The ACA collects the results from each of the SA and DA lookups, packages them in an output packet, and sends them to the appropriate NIC 100. When a cache lookup is completed, the cache lookup controller 118 signals one of the two output packet assemblies 122 bound to it (step 236). The proper assembly 122 is identified by a bit in the cache lookup packet that identifies which input interface the frame arrived on.

When the SA lookup is complete, the output packet assembly 122 starts filling the network interface output register file 124 with information that identifies the frame to the NIC 100 (step 238). The SA lookup status is then written to the register file 124 and, if the lookup was successful, associated data from the cache 28 is subsequently written to the register file 124 (step 240). When the source address portion of the output packet is complete, the output packet assembly 122 waits for the DA lookup to complete (step 242).

When the DA lookup is complete, the output packet assembly 122 writes the lookup status into the output register file 124, and, if the lookup was successful, the associated data from the cache 28 is also written to the register file 124 (step 240). The output packet assembly 122 then signals the NIC 100 when enough of the packet is in the register file 124 such that it can be delivered to the NIC 100 without under-run (step 244). The format of ACA 26 to NIC 100 communications is found in FIGS. 9A and 9B.

The bits used by the ACA 26 to report lookup status for each of the SA and DA lookups is illustrated in FIG. 14. The cache hit bit, when set, indicates that the network address was found in the cache 28 and that the associated data returned is valid. If zero, this bit indicates that the address was not found and that the associated data is not valid. If the load balanced port group (LBPG) equal bit is set, this indicates that the virtual port upon which the current frame was received is in the same LBPG as the learned port from the cache 28. For source addresses, this bit aids in determining if a station connected to an LBPG has moved. For destination addresses, it is used to filter same LBPG traffic. If the port equal bit is set, the virtual port on which the frame was received is the same as the learned port reported from the cache 28. For source addresses, this bit is useful for determining if the source has moved. For destination addresses, it is useful for filtering same segment traffic. The incomplete search bit indicates whether all valid sets associated with a cache address were searched. The soft path only bit indicates that the frame has a protocol ID not supported by hardware. The LAN Emulation Client (LEC) ID equal bit indicates whether the LEC ID number for this address equals the LEC ID number read from the cache, and is useful with ATM source addresses to determine if the source has moved. The broadcast bit indicates that the network address received by the ACA 26 from the NIC 100 was a broadcast address. The multicast bit indicates that the network address received by the ACA 26 from the NIC 100 had the group/individual bit set.

The NIC 100 monitors the four bit output interface lines 123 for a non-zero encoding. This signals the start of a transfer from the ACA 26 to the NIC 100. The NIC 100 knows the exact length of the transfer so it knows when the transfer is complete. Therefore, the next transfer can follow immediately (if ready) without an idle cycle.

Aging of MAC layer addresses is also effected by the function of the ACA 26. An external AGE RAM 130 is maintained by software or hardware and updated by input from the ACA 26. Specifically, as a MAC address is searched and located in the cache 28, an AGE table 130 address is retrieved from the data associated with the searched cache address, and a bit is set at this AGE table 130 address, indicating that the associated MAC address was "seen."

The presently disclosed ACA 26 supports both software and hardware AGE table 130 scans. The software AGE scan is controlled by software with no hardware assistance. Software chooses an address to be scanned and writes it into a register of the PIO register set 102. This is the raw AGE RAM 130 address, rather than the MAC layer or cache address. The ACA 26 reads the AGE bits for that address and returns them to the software process via the same register. If the age bits are in the UNSEEN state, the ACA will not change them. Rather, the software will cause the MAC layer address corresponding to this AGE table 130 entry to be removed by the ACA 26 (see below for the Remove command). If the age bits are in the SEEN state, the ACA changes them to UNSEEN. Software will normally not cause the removal of the MAC address entry associated with such an AGE table 130 entry. If the AGE bits are in the INVALID or STATIC state, the ACA 26 does not change them and software takes no further action with respect to them. This is a relatively time-consuming process.

The hardware scan is significantly faster and also does not adversely affect cache 28 performance since the scan does not require any cache cycles. After a predetermined interval, software causes the hardware to read (or "scan") through the AGE table 130. If an AGE table 130 entry has bits set in an INVALID state, the ACA increments the scan address and proceeds to the next AGE table address. If an entry's bits are set to the UNSEEN state, the ACA loads the AGE table address in the PIO register set 102 and terminates the scan. The software replies by commanding the ACA hardware to remove the entry from the cache 28 (discussed below), and restarts the hardware scan at the next address in the AGE table. Alternatively, the software can alter the starting point for the hardware scan by setting the address in the PIO register sets 102. Thus, the cache 26 is cleared of unused address information. If an entry is set to the SEEN state, the ACA hardware changes the entry's state to UNSEEN, increments the scan address to the next entry in the AGE table 130, and continues the scan. If an entry is in the STATIC state, this indicates that a determination has been made to keep this MAC address in the cache 28; the ACA increments the scan address and moves on.

Specific aspects of the ACA 26 functionality are described below.

Cache Hardware Functions

The ACA hardware 26 enables software access into the cache 28 for installing new entries, removing entries, changing entries and diagnosing the RAMs. The following subsections describe how each of the cache operations works and what effect they have on the corresponding entries in the LRU, VALID and AGE tables 106, 108, 130. For all of the software programmed functions described here, software polls a BUSY flag in the PIO register sets 102 at the beginning of each function, and does not begin another function until the ACA hardware has cleared the BUSY flag.

Search

The SEARCH operation is the only one described herein that is not programmed into the ACA 26 by software. The search operation is initiated by the RHP 46. The flow of frame header information through the ACA 26 including the SEARCH function, was previously described. The LRU, VALID and AGE table 106, 108, 130 bits are updated as follows. The set in which the address was found is moved up in the LRU order by one position. There in no impact on the VALID table entry. If the address hit is a MAC SA and the address is not static, the AGE bits corresponding to that address are set to the SEEN state.

Find

This hardware command is invoked by software to find a MAC layer address in the bridge cache or a network layer address in the route cache. Software loads the search address, protocol ID and opcode into the PIO register sets 102. When the opcode is loaded into the ACA hardware 26, the ACA sets a busy flag and looks up the address in the cache 28. If the address is found, the associated data and age table are put in the PIO register sets 102 for software to read. The ACA 26 sets a hit flag in a software visible status register and the busy flag is cleared. If the address is not found, the hit flag is deasserted and the busy flag is cleared. LRU, VALID and AGE table entries are not updated.

Install

This software invoked command results in the ACA hardware installing a MAC layer address in the bridge cache 28 or a network layer address in the route cache, as applicable. Software (i.e. the Frame Processor 30) loads the install address, protocol ID, associated data, age tag, age data and opcode into the PIO register sets 102. Having loaded the opcode, the ACA 26 sets the BUSY flag, performs the CRC function on the install address, and looks up the hash in the cache 28. The stored network address from each set is compared with the install address from the Frame Processor 30, and if found, the ACA terminates the search, the address is not installed, the HIT flag is set, the INSTALL FAILED flag is set, and the BUSY flag is cleared. If the address is not found in the cache 28, the address and associated data are written to the cache 28 using the LRU table 106 value for this hash address, the AGE data is written to the AGE table 130, the HIT flag is deasserted, and the BUSY flag is cleared. If there are four "locked" entries in the cache row where the install is to take place, the install will fail. A status register in the PIO register sets 102 is used to inform the software of the reason, if any, for install failure. The set into which the address was installed becomes the most recently used set. The VALID bit is set for the set into which the address was installed. The AGE table 130 is written with data supplied by software for bridge cache installs only.

Remove

Software invokes this hardware function to remove a MAC layer address from the bridge cache or a network layer address from the route cache. Software loads the remove address, protocol ID, AGE address and opcode into the PIO register sets 102, and when the opcode is loaded, the ACA sets the BUSY flag and looks up the address in the cache 28. If the address is found in the cache 28, the ACA terminates the search, sets the HIT flag, and clears the BUSY flag. If the address was not found, the HIT flag is deasserted and the BUSY flag is cleared. If the remove address hit, the set in which the address was found becomes the least recently used, the valid bit for that set is cleared, and, regardless of a hit or a miss, the age bits corresponding to the search address are set to the invalid state for bridge address removes only.

Change Data

Software uses this command to change data beats associated with a MAC layer address in the bridge cache or a network layer address in the route cache. Software loads the address, protocol ID, and opcode into the PIO register sets 102. When loaded, the ACA sets the BUSY flag and looks up the address in the cache 28. If found, the ACA terminates the search, writes the associated data to the cache 28, sets the HIT flag, and clears the BUSY flag. If the address is not found, the HIT flag is deasserted and the BUSY flag is cleared. LRU, VALID and AGE table entries are not updated.

Clear All Port

This software command causes the hardware to remove all cache entries on a particular port. Software loads the search port, protocol ID, and opcode into the PIO register sets 102. In response, the ACA 26 searches the learned port field in the associated data of all cache entries in the bridge cache or route cache for the specified port. The ACA 26 removes the entry for each cache entry in which the port is found. The CLEAR ALL BUSY flag is used by the ACA 26 to convey search status to the software. Other cache operations, having higher priority, can be set by software while the CLEAR ALL PORT command is being processed. The set in which the port was found becomes the least recently used set. The VALID bit for this set is cleared, and the AGE bits corresponding to a cleared MAC layer address are set to the invalid state.

Clear Protocol ID

This hardware function is used by software to clear all cache 28 entries having a particular protocol ID. Software loads the protocol ID and opcode into the PIO register sets 102. When the opcode is loaded, the ACA 26 searches the protocol ID field in the address beat of all cache entries in the bridge cache, or route cache for the specified protocol ID. The ACA removes the entry if the protocol ID in the PIO register matches the protocol ID in the respective cache entry. The CLEAR ALL BUSY flag is again used for this operation; the BUSY flag is not set, thus allowing other cache operations to be processed between individual protocol ID searches. If a hit occurs, the set in which the protocol ID was matched becomes the least recently used, the valid bit for this set is cleared, and the AGE bits corresponding to the MAC layer address are set to the INVALID state (bridge cache only).

Diagnostic Cache Read

The ACA reads the cache 28 at the address programmed into the PIO register sets 102 by software. This address is not a CRC hashed address, but a raw cache RAM address. The BUSY flag is set and cleared in this operation, and the read data is returned to software in the PIO register sets 102.

Diagnostic Cache Write

Software causes the ACA 16 to write the cache 28 with data via the PIO register sets 102. The address specified is the raw cache RAM 28 address, not the hashed address. The BUSY flag is set by the ACA 26 when the opcode is loaded and cleared when the address has been written to.

Diagnostic AGE Read

Software reads the AGE table 130 at a specified address conveyed to the ACA 26 via the PIO register sets 102. The BUSY flag is set when the opcode is loaded and cleared when the read is complete. The results of the read are provided in the PIO register sets 102.

Diagnostic AGE Write

The ACA writes the AGE table 130 with data provided by the software at a software-specified address, both values being conveyed via the PIO register sets 102. The BUSY flag is set when the opcode is loaded and cleared when the write is complete.

Diagnostic LRU/VALID RAM Read

Software employs this function to cause the ACA 26 to read the LRU/VALID RAM 106, 108 at an address provided by the software via the PIO register sets 102. This operation can only be done when the cache 28 is off. The BUSY flag is set when the opcode is loaded and cleared when the read is complete. Read data is returned via the PIO register sets 102.

Software and Hardware Age Scans

These functions are described in the foregoing.

Flush All

When software invokes this command, the ACA 26 flushes the cache 26 and the AGE RAM 130, setting all VALID bits to zero, setting all LRU entries to "0123", and setting all AGE entries to INVALID. The BUSY, FLUSH CACHE BUSY and FLUSH AGE BUSY flags are set when this command is being processed by the ACA 26. All cache searches from the NICs 100 are forced to miss if this operation is programmed while the network is active. The bridge cache and the route cache are flushed by this operation.

Flush Cache

The ACA 26 sets all VALID bits to zero and sets all LRU entries to "0123" in response to this software invoked command. The BUSY and FLUSH CACHE flags are set when this operation is in progress. All cache searches from the NICs 100 are forced to miss if this operation is programmed while the network is active. The bridge cache or the route cache are flushed by this operation, but not both. To flush the bridge cache, a protocol ID field in a PIO register set 102 must be programmed to a bridge protocol ID. To flush the route cache, a protocol ID field in a PIO register set 102 must be programmed to a route protocol ID.

Flush AGE

Software uses this command to flush the AGE RAM 130, resulting in all entries in the AGE RAM set to the INVALID state. The BUSY and FLUSH AGE BUSY flags are set when this operation is in progress.

Cache Operating Modes

In a preferred embodiment, the cache 28 can be configured under software control to operate in one of four modes, by the setting of configuration bits in the PIO register sets 102. These operating modes are as follows.

Disable Mode

When the cache 28 is placed in the disable mode, it is accessible only through the diagnostic read and write operations (see above). Address searches are not performed in this mode; any operation requiring an address search is terminated with "miss" status even if the address is in the cache 28. While the system will continue to work in this mode, all address lookups being handled by software, the system performance is severely degraded. Flush operations and LRU/VALID read operations also work in this mode.

Learn Mode

In this mode, the cache is accessible only through the PIO register sets 102. All of the software functions defined above work so that the cache 28 can be diagnosed and addresses can be installed. Addresses from the NICs 100 are not searched in the cache 28, resulting in a cache "miss" and the return of the appropriate miss status to the NIC 100. This mode is appropriate for use after a cache flush since the hit rate in the cache 28 will be very low at that time.

Bridge Only Mode

In this mode, the entire cache 28 is used for layer 2 addresses. Attempts to install, remove or search for route address will be unsuccessful because the ACA 26 does not search for a route address in the cache 28 when in this mode.

Bridge/Route Mode

In this mode, the cache 28 is divided in half. One half is reserved for layer 2 (bridge) addresses and the other half is reserved for layer 3 (route) addresses. The ACA 26 uses the protocol ID field in a received frame header to determine which half of the cache 28 to operate on.

LAN Trunking

The bridge/router of which the presently disclosed ACA 26 is a part supports a feature called Load Balanced Port Groups (LBPG). An LBPG is a group of ports that act like a single high bandwidth port. Received frames destined for an LBPG are distributed across the output ports making up the group. The ACA 26 is responsible for choosing the destination port within the LBPG for a particular frame being processed such that each port in the LBPG has approximately the same load. The ACA 26 supports up to four LBPGs in a first embodiment, each group having two to eight ports assigned to it.

Software is responsible for setting up each LBPG. The specific ports in each group, the number of ports in each group, and the number of enabled ports in each group are programmed into the PIO register sets 102 in the ACA 26 by software. The number of ports in a group refers to the number of ports that can access the trunk. The number of ports enabled is the number of ports on which frames can be transmitted.

A forty bit mask register is also set up by software for performing load balancing among LBPGs. The presently disclosed bridge/router supports twenty-four ports, so sixteen bits of this mask register are for future expansion. A bit corresponding to a port in the LBPG is set to one. A port which is not part of the LBPG is set to zero.

Ports need not be consecutive to be in one group, though a port cannot be in more than one group. Each LBPG can have from two to eight ports.

The ACA 26 performs the following functions to ensure that load balancing is performed fairly. It must identify a port within an LBPG on which to transmit a unicast frame. It must generate a port mask indicating to which ports a multicast frame is to be transmitted. It must indicate if the receive port is in the same LBPG as the port on which the source address was learned. Finally, the ACA 26 must indicate if the receive port is in the same LBPG as the port on which the destination address was learned.

To identify the transmit port for a unicast frame, the ACA 26 must first determine if the learned port read from the address cache 288 in a lookup operation is in one of the LBPGs. If not, the transmit port is the learned port from the cache 28. If it is in one of the groups, the ACA 26 must select one of the enabled ports in that group for transmit.

The ACA 26 takes the sixteen bit CRCs generated on the SA and DA and XORs them together to generate a conversation based hash called the LBPG_HASH. The ACA 26 then performs modulo four operations on the LBPG_HASH with the port enable field for each group. Specifically, the number of enabled ports in this group is divided into the LBPG_HASH, and the remainder is used to identify the port in each group. Which, if any, of the groups has the final transmit port is determined by identifying which group the learned port from the cache falls into and selecting the port from that group.

Which group the receive port falls in is also identified. The ACA 26 then determines if the learned port from the cache is from the same group. If the receive port is not in the same group as the source address learned port, the source station has moved. If the receive port is in the same group as the destination address learned port, the frame does not need to be transmitted since it is same segment traffic.

It is desired to send return traffic over a different port from the receive port. This is accomplished by inverting the CRC hash of the source address, XOR'ing this inverted value with the hashed DA to form the conversation based hash, and identifying the transmit port from each group. This procedure does not guarantee a port different from the source port, but provides a high probability that different ports will be employed for transmission and reception between a pair of addresses.

For multicast, the ACA 26 generates a mask indicating which ports to send the frame out on. Multicast frames are transmitted out only one port of an LBPG and load balancing is maintained across the ports in the groups. The ACA 26 uses LBPG port mask register to generate a multicast port mask for the NIC 100, with a logical one indicating the chosen port. If the receive port is in one of the LBPGs, the ACA does not set the mask bit for the group since this is the same as same segment traffic filtering.

Flexible Address Lookup Engine

In a preferred embodiment of a bridge/router in which the presently disclosed ACA 26 is employed, Virtual Local Area Networks (VLANs) are supported. Such VLANs enable communication between stations which are members of the same VLAN as defined by a VLAN tag. Whether or not the bridge/router is configured to support such VLANs effects the number of bytes in a MAC address which are needed for proper addressing. A bit is set by software in one of the PIO registers 102 to indicate to the ACA 26 whether VLAN support is enabled. When VLAN enable is off (single bridge mode), the ACA 26 hashes six bytes of MAC source addresses and MAC destination addresses for comparison with six bytes of address read from the cache 28. When VLAN support is enabled (multi-bridge mode), the ACA 26 hashes six bytes of MAC source address or MAC destination address each concatenated with one byte of VLAN identification (seven bytes total) for comparison with seven bytes of VLAN identification and address information read from the cache 28. Therefore, in single bridge mode, installed addresses should have at least six bytes of address data, and in multi-bridge mode, installed addresses should have seven bytes of address data.

Programmable CRC Hash Function

The CRC engine 104 employs a sixteen bit CRC register and 16×16 register file for the CRC operation. The CRC is performed four bits at a time. The CRC register is initially all zeroes. Four bits of address from the received frame header are then shifted into the CRC register. A CRC operation is then performed on the CRC register using one of the values from row zero of the 16×16 CRC register file and the result overwrites the previous values of the CRC register. Four bits of address are shifted in, and four bits are shifted out, the latter being used as an index into the 16×16 register file. Evantually, after the fourth shift, a non-zero value will likely be shifted out and used for indexing into the CRC register file. Once the entire received address has been processed, the contents of the CRC register are used as the hash value.

It is possible that one row in the cache 28 can be indexed by more than four active addresses, causing a condition known as thrashing. Thrashing results when more than one active connection contends for valid sets, alternately resulting in cache contents being removed, then installed. A thrash counter is implemented in ACA hardware 26 for tracking the number of times a valid address is removed in favor of another valid address. If this counter value exceeds a predetermined threshold value over a given interval, the CRC register file can be changed (by software writing to each of the addresses in the file range) in the hope that such new CRC values will lower the thrash rate.

The cache 28 must be disabled while the CRC table is being altered, and the cache 28 must be flushed before being re-enabled since all hash results will be effected by the rewriting of the CRC register file.

These and other examples of the invention illustrated above are intended by way of example and the actual scope of the invention is to be limited solely by the scope and spirit of the following claims.

What is claimed is:

1. A method for selecting an output port eligible to be used for transmission of a frame received at a computer network device, wherein said computer network device has at least one input port and a plurality of output ports and said received frame has a source address and a received destination address, said method comprising the steps of:

receiving said frame at one of said at least one input port of said computer network device;

parsing said received destination address from said received frame;

processing said received destination address with a code generator to generate a coded address;

comparing said coded address to a value associated with a row within a cache;

in the event of a match between said coded address and said value associated with said row, comparing said received destination address with a cached destination address associated with a first entry in said row;

in the event of a match between said received destination address and said cached destination address associated with said first entry, reading a port mask associated with said first entry to identify at least one port from said plurality of output ports which is eligible for transmission of said received frame.

2. A method of forwarding a data unit through a network element having a cache comprised of plural rows, each having plural respective entries, the method comprising the steps of:

receiving said data unit at said network element;

parsing said data unit for address information;

encoding said received address information;

using said received, encoded address information to identify one of said cache rows;

retrieving first address information from a first entry of said identified row;

comparing said retrieved first address information with said received address information;

retrieving second address information from said first entry of said identified row if said comparison of said retrieved first address information and said received address information yields a first result; and using said retrieved second address information for forwarding said data unit.

3. The method of claim 2, further comprising the steps of retrieving first address information from a subsequent entry of said identified row if said comparison of said retrieved first address information of said first entry and said received address information yields a second result, then repeating said comparing, retrieving second address information, and using steps.

4. The method of claim 3, wherein said step of encoding said received address information further comprises cyclic redundancy encoding said received address information.

5. The method of claim 3, further comprising the step of packetizing said received, encoded address information with an indication of which of said plural entries is to be used first in said step of retrieving first address information.

6. The method of claim 5, wherein said step of packetizing further comprises referencing a usage tracking table to determine which of said plural entries is to be used first.

7. The method of claim 5, wherein said step of packetizing further comprises referencing a validity table to determine which of said plural entries is to be used first, said validity table providing an indication, for each of said cache entries, whether said entry is enabled for providing said first and second address information.

8. A cache management unit of a data unit forwarding network device, comprising:
   an input register for receiving data unit header information including received source and destination address;
   a cyclic redundancy code (CRC) generator in communication with said input register for executing a CRC algorithm on each of said received source and destination addresses from said input register to form respective CRC encoded addresses;
   an input packetizer in communication with said CRC generator and paid input register for formatting said CRC encoded addresses and for receiving said received source and destination addresses from said input register;
   a cache lookup unit and an associated cache in communication with said input packetizer for searching said cache with said formatted CRC encoded addresses;
   an output packetizer in communication with said cache lookup unit for receiving and formatting retrieved source and destination address information from said cache; and
   an output register in communication with said output packetizer for receiving said formatted retrieved source and destination address information.

9. The cache management unit of claim 8, wherein said input register is further for receiving an identifier of a received data unit protocol, and wherein said input packetizer formats said CRC encoded addresses with said protocol identifier.

10. The cache management unit of claim 8, wherein said ache lookup unit comprises a cache lookup queue for storing said formatted CRC encoded addresses.

11. The cache management unit of claim 8, wherein said cache lookup unit comprises a cache lookup controller for searching said cache with said formatted CRC encoded addresses.

12. The cache management unit of claim 8, wherein said cache is provided as plural rows each having plural entries, each entry comprising an address value and an associated data value.

13. The cache management unit of claim 12, wherein said cache lookup controller is adapted for identifying a row of said cache using said CRC encoded addresses.

14. The cache management unit of claim 12, wherein said cache lookup controller is adapted for comparing one of said received source and destination addresses to said address value of at least one of said plural entries of said identified cache row, and if said comparison generates a first value, returning said associated data value as one of said retrieved source and destination address information.

15. The cache management unit of claim 12, further comprising a usage tracking table associated with said input packetizer for maintaining an ordered list, for each of said plural rows, of which of said plural entries is to be searched first upon receipt by said cache lookup unit of a CRC encoded address, said input packetizer for addressing said usage tracking table using one of said CRC encoded addresses.

16. The cache management unit of claim 15, further comprising a validity table associated with said input packetizer for maintaining an indication, for each of said entries of said cache whether said data value of the respective entry is to be compared to said CRC encoded addresses, said input packetizer for addressing said validity table using one of said CRC encoded addressee.

17. The cache management unit of claim 16, further comprising an I/O register for interfacing said cache management unit to an external processor, said I/O register for enabling processor configuration of said CRC generator, said usage tracking table, and said validity table.

18. The cache management unit of claim 17, wherein said I/O register is further for interfacing said cache management unit to an external age table having entries reflecting whether each of said entries in said cache has been accessed by said cache lookup unit during a specified interval, said I/O register for enabling said age table to be read and updated.

19. The cache management unit of claim 16, wherein said cache lookup unit is for receiving said CRC encoded addresses from said input packetizer, for identifying a cache row using said CRC encoded address, for referencing a respective usage tracking table value to identify which of said cache entries for said identified cache row is to be referenced first by said cache lookup unit, for referencing a respective validity table entry for said identified entry to determine if said identified entry is valid, for comparing said received address with said address value of said identified, valid cache entry, and for retrieving said data value associated with said identified, valid cache entry if said comparison is made.

20. The cache management unit of claim 19, wherein said cache lookup unit is further for referencing said respective usage tracking table value to identify which of said remaining cache entries for said identified cache row is to be referenced next if said comparison is not made.

21. A network device for selectively forwarding a received data unit, comprising
   a data unit header processor for receiving said data unit and for processing header data associated with said received data unit;
   a cache having plural rows, each of said rows having plural entries, wherein each of said entries has an address and is comprised of a first value and a second value;
   a cache management unit associated with said cache and in communication with said data unit header processor; and
   a data unit forwarding engine, in communication with said cache management unit and said data unit header processor, for dispatching said data unit in response to data unit characterizing information from said data unit header processor and said cache management unit, wherein said cache management unit is adapted for receiving said header data from said data unit header processor, for using said header data as said cache address to identify a cache entry, to retrieve cache data associated with said cache entry, and for providing said cache data to said data unit forwarding engine as part of said data unit characterizing information.

22. The network device of claim 21, wherein said cache management unit further comprises a cyclic redundancy code (CRC) generator for CRC encoding said header data and for using said CRC encoded header data as said cache entry address.

23. The network device of claim 22, wherein said cache management unit is further for comparing said received header data with said first cache entry value referenced by said CRC encoded header data, and for retrieving said second cache entry value as said cache data to be provided to said data unit forwarding engine if said received header data equals said first cache entry value.

24. The network device of claim 23, wherein said cache management unit further comprises a usage tracking table having a respective entry for each of said cache rows, said cache management unit using said usage tracking table entry to determine which of said respective cache entries is to be compared first.

25. The network device of claim 23, wherein said cache management unit further comprises a validity table having a respective entry for each of said cache entries, said validity table entries indicating whether said respective cache entry is a valid entry for said comparison.

26. The network device of claim 23, further comprising an age table, capable of being updated by said cache management unit, for indicating whether each of said cache entries has been accessed by said cache management unit within a specified time period.

* * * * *

UNITED STATES PATENT AND TRADEMARK OFFICE
CERTIFICATE OF CORRECTION

PATENT NO : 5,978,951
DATED : November 2, 1999
INVENTOR(S) : Christopher P. Lawler, et al.

It is certified that error appears in the above-identified patent and that said Letters Patent are hereby corrected as shown below:

```
Column 15, line 63, "Evantually", should read --Eventually--;

Column 16, line 35, "a cache", should read --said cache--;

Column 17, line 32, "paid", should read --said--;

Column 17, line 52, "ache", should read --cache--; and

Column 18, line 20, "addressee", should read --addresses--.
```

Signed and Sealed this

First Day of May, 2001

*Attest:*

NICHOLAS P. GODICI

*Attesting Officer*      *Acting Director of the United States Patent and Trademark Office*